United States Patent
Choo et al.

(10) Patent No.: US 7,037,791 B2
(45) Date of Patent: May 2, 2006

(54) APPLICATION OF SINGLE EXPOSURE ALTERNATING APERTURE PHASE SHIFT MASK TO FORM SUB 0.18 MICRON POLYSILICON GATES

(75) Inventors: Lay Cheng Choo, Singapore (SG); James Yong Meng Lee, Singapore (SG); Lap Chan, San Francisco, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 612 days.

(21) Appl. No.: 10/135,071

(22) Filed: Apr. 30, 2002

(65) Prior Publication Data

US 2003/0203580 A1 Oct. 30, 2003

(51) Int. Cl.
*H01L 21/336* (2006.01)
*G03C 5/00* (2006.01)
*G03C 5/16* (2006.01)

(52) U.S. Cl. .............. 438/296; 438/592; 438/949; 430/311; 430/349; 430/396

(58) Field of Classification Search .......... 438/296, 438/592, 618, 949; 430/311, 349, 396, 314
See application file for complete search history.

(56) References Cited

U.S. PATENT DOCUMENTS

| | | | |
|---|---|---|---|
| 5,468,578 A | | 11/1995 | Rolfson .............. 430/5 |
| 5,573,890 A | * | 11/1996 | Spence ............. 430/311 |
| 5,582,939 A | | 12/1996 | Pierrat .............. 430/5 |
| 5,670,281 A | * | 9/1997 | Dai ................ 430/5 |
| 5,698,902 A | * | 12/1997 | Uehara et al. ...... 257/773 |
| 5,935,740 A | | 8/1999 | Pierrat ............. 430/5 |

OTHER PUBLICATIONS

Hua-yu, Liu; Three Paths to Improved Critical dimension Control for Patterning 200nm to 100nm Transistor gates; Microelectronic Engineering 46 (199) pp. 41-45.*

* cited by examiner

*Primary Examiner*—Michael Lebentritt
*Assistant Examiner*—Ron Pompey
(74) *Attorney, Agent, or Firm*—George D. Saile; Rosemary L. S. Pike; Stephen B. Ackerman

(57) ABSTRACT

In accordance with the objects of this invention, a new method of fabricating a polysilicon gate transistor is achieved. An alternating aperture phase shift mask (AAPSM) is used to pattern polysilicon gates in a single exposure without a trim mask. A semiconductor substrate is provided. A gate dielectric layer is deposited. A polysilicon layer is deposited. The polysilicon layer, the gate dielectric layer and the semiconductor substrate are patterned to form trenches for planned shallow trench isolations (STI). A trench oxide layer is deposited filling the trenches. The trench oxide layer is polished down to the top surface of the polysilicon layer to complete the STI. A photoresist layer is deposited and patterned to form a feature mask for planned polysilicon gates. The patterning is by a single exposure using an AAPSM mask. Unwanted features in the photoresist pattern that are caused by phase conflicts overlie the STI. The polysilicon layer is etched to form the polysilicon gates.

20 Claims, 13 Drawing Sheets

APPLICATION OF SINGLE EXPOSURE ALTERNATING APERTURE PHASE SHIFT MASK TO FORM SUB 0.18 MICRON POLYSILICON GATES

BACKGROUND OF THE INVENTION (1) Field of the Invention

The invention relates to a method of fabricating semiconductor structures, and more particularly, to a method of using an alternating aperture phase shift mask to fabricate sub 0.18 micron polysilicon gate transistors.

(2) Description of the Prior Art

Device shrinkage requires photolithographic enhancements to extend the capabilities of the processes. One such enhancement is the use of phase shift masks. Phase shifting masks are used when the desired feature size of an integrated circuit layer is on the same order of magnitude as the wavelength of light used in the photolithographic process.

In a typical photolithographic mask, layer features, or traces, are formed on the mask in an opaque material such as chrome. This chrome layer is formed overlying a transparent quartz substrate. Light is shown through this mask to expose a photosensitive material, commonly photoresist, as defined by the mask pattern. After the photoresist is developed, the photoresist will reflect a copy or a reverse copy of the mask pattern.

As the pattern features approach the wavelength of the exposure light and the limits of the photolithographic equipment alignment and repeatability, it is increasingly difficult to successfully transfer the pattern features. In practice, it is found that the current 248 nanometer lithographic tools cannot reliably create patterns below 0.15 microns.

One approach to extending the capability of the current lithographic technology is the application of phase shifting masks. In a phase shifting mask, an additional component is added to the chrome and quartz system. Either through the application of an additional transparent layer or the through the removal of a portion of the quartz layer to a specific depth, the optical properties are changed in a part of the transparent (not covered by chrome) sections of the mask. Specifically, when light of the lithographic wavelength is shown through the mask, a phase shift is created between light waves that pass through the phase shifted area and the light waves that pass through the non-phase shifted area. By shifting the phase of the light by 180 degrees, nodes, or cancellations of energy will occur at opaque boundaries between the phase shifted and non-phase shifted areas. This principle is used to create more sharply defined boundary conditions during the photolithographic exposure. Sharper definition leads to improved pattern transfer.

The phase shifted mask principle has been applied using an alternating aperture phase shift mask (AAPSM) approach. In AAPSM, the transparent mask sections are alternated between 0 degrees (non-shifted) and 180 degrees (shifted). The resolution limit of periodic line patterns can be improved by a factor of two using AAPSM. However, application of AAPSM to random lines is limited and made difficult due to phase conflicts at direct boundaries between phases where no opaque line separates the phase areas. Techniques that have been employed to eliminate these problems include utilizing a multiphase boundary (such as 60 degrees steps) and using a binary trimming mask to expose the unwanted areas. The use of multiphase AAPSM causes problems in mask fabrication and cause space constraints.

The use of the prior art binary trim mask method is illustrated beginning in FIG. 1. A cross section of a prior art device is shown. A semiconductor substrate 10 is provided. Shallow trench isolations (STI) 14 are formed in the semiconductor substrate 10. The STI 14 separate and isolate active areas. A gate oxide layer 18 is formed overlying the semiconductor substrate 10 and the STI regions 14. A polysilicon layer 22 overlies the gate oxide 18. Note that the top surfaces of the STI regions 14 are co-planar with the top surface of the semiconductor substrate 10.

Referring now to FIG. 2, a top view of a planned memory cell 38 is shown. In this cell, two p-well active areas 30 and two n-well active areas 32 are shown. Polysilicon traces 34 overlie the active areas 30, 32 to form transistors 36. Six transistors are formed in the memory cell. Note that the polysilicon layer 34 also provides common connectivity for the cell.

Referring now to FIG. 3, a first mask 39 used for the first step of patterning the planned polysilicon traces is shown. Chrome traces 42 are formed with the minimum lithographic width L1 for the typical process. This mask represents the binary image of the layout of the polysilicon layer for the cell. Non chrome areas are transparent. For example, the minimum width L1 is 0.18 microns. This same minimum width L1 is used even in the transistor areas 36. Following the application of a photoresist layer overlying the polysilicon layer 22 of FIG. 1, a first exposure is performed using the chrome mask 39 of FIG. 3. Following the first exposure, the photoresist is not developed.

Referring now to FIG. 4, a second mask 41 is shown. This mask utilizes an alternating aperture phase shift mask (AAPSM) approach. The second mask 41 is a dark field mask so that most of the area is chrome 51 with openings 46, 50. Non-phase shifting areas 46 are formed parallel to phase shifting areas 50. Both the non-phase shifting areas 46 and the phase shifting areas 50 allow light passage. Both non-phase shifting areas 46 and phase shifting areas 50 overlap the chrome pattern of the first mask 39 of FIG. 3. The space L2 between the non-phase shifting areas 46 and the phase shifting areas 50 is smaller than the minimum width L1 of the chrome mask 39. In the art, the minimum space L2 between phase areas is between about 0.09 microns and 0.15 microns. This second mask 41 is used in a second exposure of the photoresist and acts a trim mask because the second exposure trims back some of the unexposed photoresist. The presence of the non-phase shifting areas 46 and the phase shifting areas 50 allows a narrower line width to be formed in the photoresist.

Referring now to FIG. 5, the top view of the resulting memory cell 47 is shown. After the second exposure step, the photoresist layer is developed. The polysilicon layer is etched to form traces 54. Note that the polysilicon layer 54 is narrower in the gate regions where it overlies the active areas for the p-well 30 and n-well 32. The two mask AAPSM sequence allows shorter gate length transistors to be formed.

Referring to FIG. 6, a cross sectional view of the finished prior art device is shown.

There are three drawbacks to the process of the prior art. First, this process requires two masking steps that must be very carefully aligned. This is both expensive and time consuming. Second, because the polysilicon layer 54 is used as both the interconnecting layer and the gate layer, the memory cell must be made relatively large. The polysilicon layer 54 connectivity points must be sufficiently spaced from the active areas 30, 32 so that parasitic transistors are not created. Third, if the first and second masking steps are not perfectly aligned, open or high resistivity connections can be created.

Referring now to FIG. 7, a representative top view of a transistor created in the prior process is shown. The polysilicon layer 54 overlies the p-well active area 30 to form a transistor. A misalignment between the first chrome mask 39 and the second phase shifting mask 41 has caused the connectivity section of the polysilicon to be offset 58 from the gate. Though this is not an open circuit, the offset will cause a larger than normal gate resistance that will diminish device performance.

Several prior art approaches concern methods to create or to use phase shifting masks in the manufacture of integrated circuits. U.S. Pat. No. 5,468,578 to Rolfson teaches a process to form alternate aperture phase shift masks (AAPSM) where two E-beam writes are used. A four step method is disclosed to: (1) identify phase conflict areas in the mask data; (2) connect together adjacent planned transparent areas in phase conflict locations; (3) deposit and pattern opaque material to form transparent areas; and (4) phase shifting areas by either etching down transparent areas or by adding phase shifting material in every other transparent opening and in all connecting areas. U.S. Pat. No. 5,670,281 to Dai discloses a method to form phase shift masks that eliminates bridging problems due to phase conflicts at the ends of parallel features. Fine tips, that is, triangle shaped ends, are used to eliminate phase conflict problems. Methods for forming 180 degree phase shift material using either subtraction of transparent material or addition and patterning of a phase shift layer are disclosed. U.S. Pat. No. 5,935,740 to Pierrat discloses a process to form alternate aperture phase shift masks where multiple layers of light transmitting, phase shifting material are used. Each phase shifting layer is optimized to shift the incident light 60 degrees. By patterning the phase shifting layers, complementary phase shifting patterns are created in adjacent circuit areas. U.S. Pat. No. 5,582,939 to Pierrat teaches a process to form phase shift masks where bump defects in the phase shifting material are removed.

SUMMARY OF THE INVENTION

A principal object of the present invention is to provide an effective and very manufacturable method of fabricating a polysilicon gate transistor in the manufacture of integrated circuits.

A further object of the present invention is to provide a method of a fabricating polysilicon gate transistor where an alternating aperture phase shift mask (AAPSM) is used to pattern the polysilicon gates.

A yet further object of the present invention is to provide a method of fabricating a polysilicon gate transistor where an alternating aperture phase shift mask (AAPSM) is used to pattern the polysilicon gates using a single alignment and exposure step.

Another yet further object of the present invention is to provide a method of fabricating a polysilicon gate transistor where an alternating aperture phase shift mask (AAPSM) is used to pattern the polysilicon gates where unwanted pattern features in the lithographic process caused by phase conflicts fall over shallow trench isolation (STI) regions and are therefore not transferred to the polysilicon layer.

Another further object of the present invention is to provide a method of fabricating polysilicon gate transistor wherein tungsten silicide or a combination of titanium and titanium nitride is used to form interconnect lines to the polysilicon gate transistor.

Another object of the present invention is to provide a method of fabricating an alternating aperture phase shift mask (AAPSM) for use in forming polysilicon gate transistors in the manufacture of an integrated circuit device.

Another further object of the present invention is to provide a method of fabricating an AAPSM where the phase shift layer is adjacent to the opaque layer used to define the polysilicon gate and overlaps the active area onto the STI region so that unwanted patterns due to phase conflicts fall onto the STI regions.

In accordance with the objects of this invention, a new method of fabricating a polysilicon gate transistor is achieved. A semiconductor substrate is provided. A gate dielectric layer is formed overlying the semiconductor substrate. A polysilicon layer is deposited overlying the gate dielectric layer. The polysilicon layer, gate dielectric layer, and semiconductor substrate are patterned to form trenches for planned shallow trench isolations. A trench oxide layer is deposited overlying the polysilicon layer and thereby filling the trenches. The trench oxide layer is polished down to the top surface of the polysilicon layer to complete the shallow trench isolations. A photoresist layer is deposited overlying the polysilicon layer and the shallow trench isolations. The photoresist layer is patterned to form a feature mask for planned polysilicon gates. The patterning is by a single exposure using an alternating aperture phase shift mask (AAPSM). Unwanted features in the photoresist pattern that are caused by phase conflicts overlie the shallow trench isolations. The polysilicon layer is etched to form the polysilicon gates. The photoresist layer is stripped away. Ions are implanted to form lightly doped drains. Silicon nitride sidewall spacers are formed adjacent to the polysilicon gates and the shallow trench isolations. Ions are implanted to form source and drain regions. A titanium silicide layer is formed in the semiconductor substrate source and drain regions and in the polysilicon gates. An interlevel oxide layer is deposited overlying the polysilicon gates, the source and drain regions, and the shallow trench isolations. The interlevel oxide layer is polished down to the top surface of the polysilicon gates. A conductive layer is deposited overlying the polysilicon gates. The conductive layer may comprise tungsten silicide or a combination of titanium and titanium nitride. The conductive layer is patterned to form interconnect lines from the polysilicon gates to other circuit features and to complete the fabrication of the polysilicon gate transistor in the manufacture of the integrated circuit device.

Also in accordance with the objects of this invention, a method to fabricate an alternating aperture phase shift mask (AAPSM) for use in forming polysilicon gate transistors in the manufacture of an integrated circuit device is achieved. An opaque layer is provided overlying a transparent substrate. The opaque layer is patterned to form opaque features that will overlie a portion of active areas of planned transistors. The opaque layer may be patterned to form either a clear field or dark field mask. The opaque features will overlap the boundaries of the active areas onto the shallow trench isolations. A phase shifting layer is formed in a portion of the transparent substrate adjacent to the opaque features on one side of each planned transistor. The phase shifting layer will overlie a portion of active areas for planned transistors. The phase shifting layer will overlap the boundaries of the active areas onto the shallow trench isolations so that unwanted features due to phase conflicts will overlie the shallow trench isolations.

Also in accordance with the objects of this invention, an alternating aperture phase shift mask (AAPSM) for use in forming polysilicon gate transistors in the manufacture of an integrated circuit device is achieved. A patterned opaque layer overlies a transparent substrate. The patterned opaque layer features overlie a part of planned active areas of planned transistors. The patterned opaque layer features overlap the boundaries of the planned active areas onto the planned shallow trench isolations. The patterned opaque layer is absent from all other areas. A patterned phase shifting layer overlies the transparent substrate adjacent to the opaque features on one side of each planned transistor. The phase shifting layer overlies a part of planned active areas and overlaps the boundaries of the planned active areas onto the planned shallow trench isolations so that unwanted features due to phase conflicts overlie the planned shallow trench isolations.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of polysilicon gate transistors in the manufacture of an integrated circuit device. A method to form the alternating aperture phase shift mask is also disclosed. It should be clear to those experienced in the art that the present invention can be applied and extended without deviating from the scope of the present invention.

Figure 8:
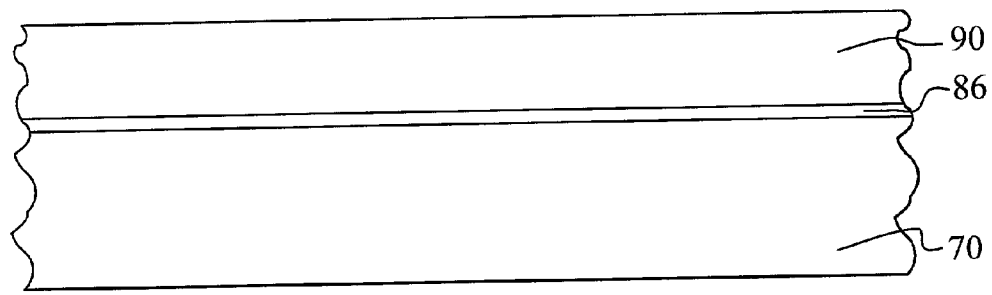
FIGS. 8 through 23 schematically illustrate in cross-sectional representation a preferred embodiment of the present invention.

Referring now particularly to FIG. 8, there is shown a cross section of a partially completed integrated circuit device of the preferred embodiment. A semiconductor substrate 70, typically consisting of monocrystalline silicon, is provided. A gate dielectric layer 86 is formed overlying the semiconductor substrate 70. The gate dielectric layer 86 serves as the gate oxide for the MOS transistors. The gate dielectric layer 86 is formed using either a thermal oxidation or a low-pressure, chemical vapor deposition (LPCVD) process. The gate dielectric layer 86 is formed to a thickness of between about 15 Angstroms and 70 Angstroms. A polysilicon layer 90 is deposited overlying the gate dielectric layer 86. The polysilicon layer 90 is preferably deposited by a LPCVD process to a thickness of between about 1,500 Angstroms and 2,500 Angstroms. The combined thickness of the polysilicon layer 90 and the gate dielectric layer 86 will determine how far the subsequently formed shallow trench isolations will extend above the surface of the semiconductor substrate 70.

Figure 9:
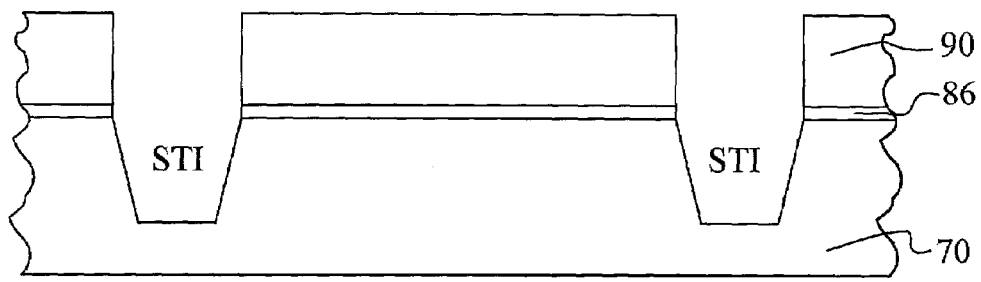
Figure 10:
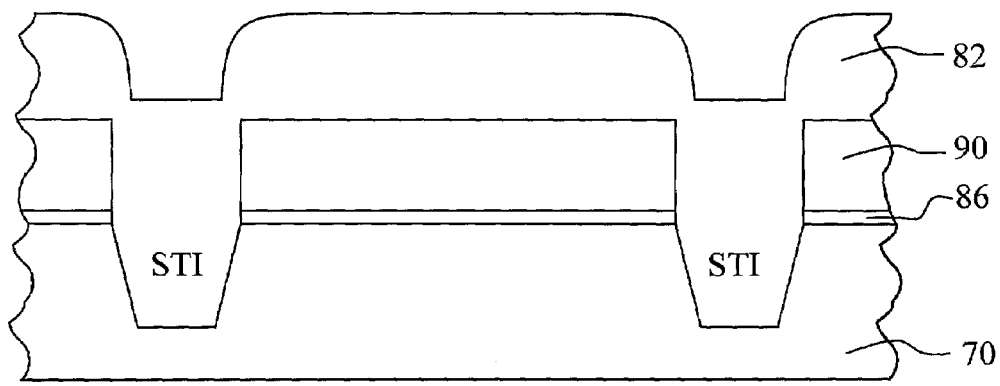

Referring now to FIG. 9, the polysilicon layer 90, gate dielectric layer 86, and semiconductor substrate 70 are patterned to form trenches for planned shallow trench isolations. Following the trench etch, a trench oxide layer 82 is deposited overlying the polysilicon layer 90 and filling the trenches as shown in FIG. 10. The trench oxide layer 82 is typically comprised of silicon dioxide deposited using a high density plasma (HDP) or LPCVD process.

Figure 11:
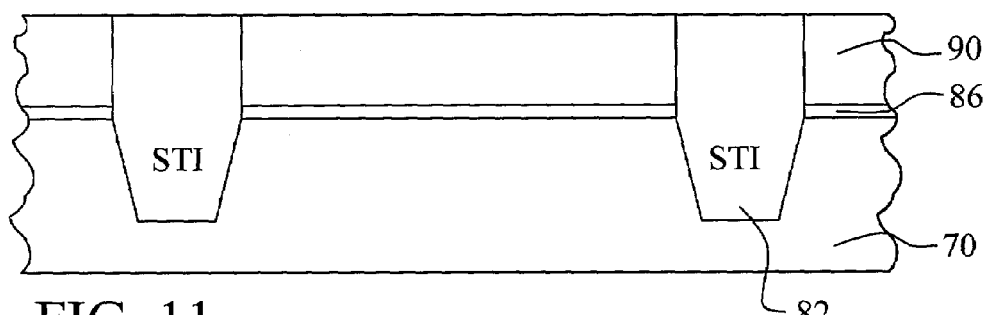

Referring now to FIG. 11, an important part of the invention is illustrated. The trench oxide layer 82 is polished down to the top surface of the polysilicon layer 90 to complete the shallow trench isolations (STI) 82. Note that the amount by which the STI regions 82 extend above the semiconductor substrate 70 is approximately the thickness of the polysilicon layer 90 deposited earlier. The extension of the STI regions 82 above the semiconductor substrate 70 will allow the AAPSM method of the present invention to pattern polysilicon transistor gates with a single mask exposure. The shallow trench isolations 82 extend above the top surface of the semiconductor substrate 70 to a height of between about 1,000 Angstroms and 3,500 Angstroms.

Figure 12:
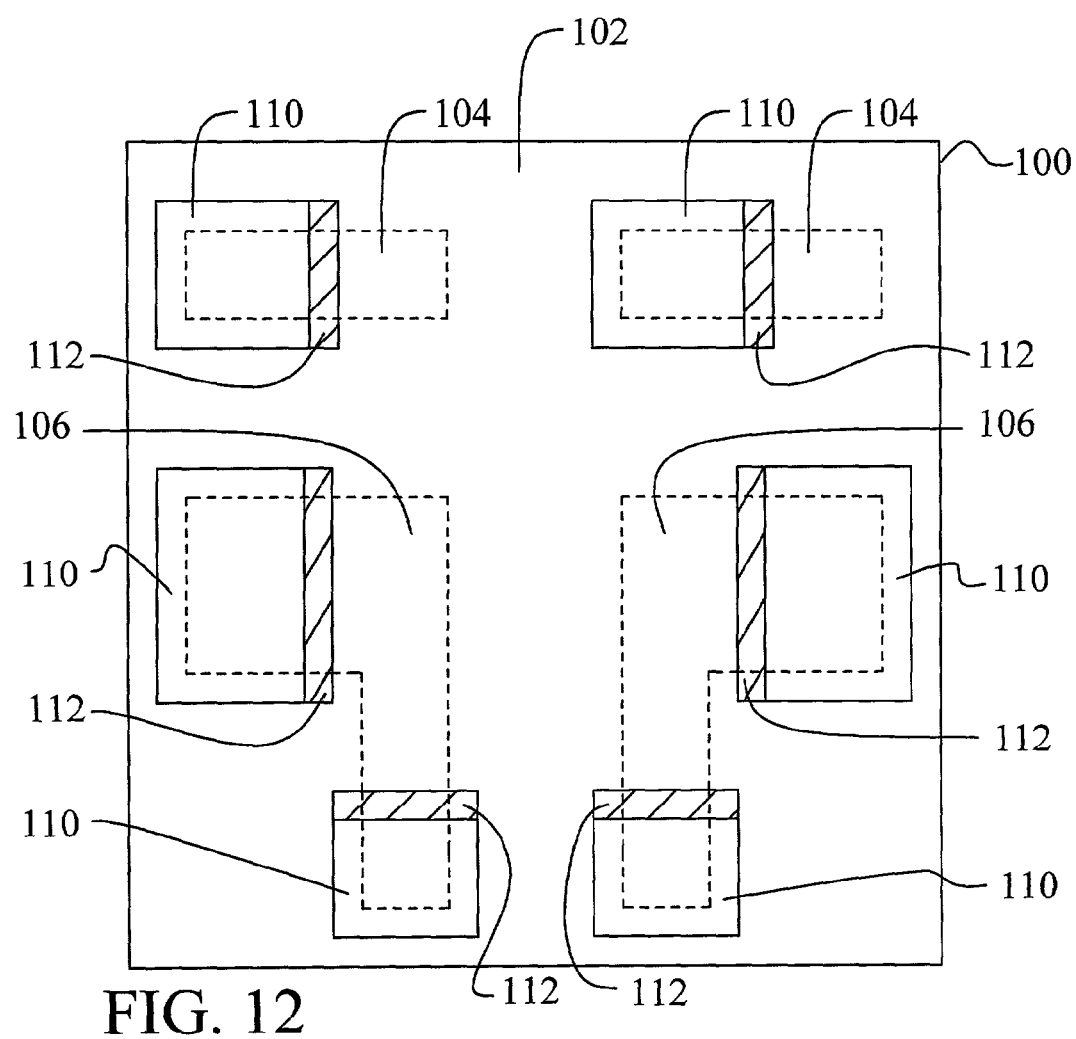

Referring now to FIG. 12, an important feature of the present invention is shown. An alternating aperture phase shift mask (AAPSM) 100 is depicted. The AAPSM 100 will be used in the formation of a memory cell comprising six transistors. This mask is a clear field version of the layout data. The AAPSM 100 is shown overlying active areas of p-well type 104 and n-well type 106.

The mask 100 is comprised of a transparent substrate 102, opaque features 112, and phase shift features 110. The transparent substrate 102 is conventionally comprised of quartz. The opaque features 112 conventionally comprise chrome that is patterned to correspond to the placement of the planned polysilicon gates. Note that the opaque features 112 define the polysilicon gates by crossing the active areas 104, 106. The opaque features 112 overlap onto the non-active areas where shallow trench isolations are defined.

The phase shift features 110 are be formed by targeting a phase shift of 180 degrees for the incident light compared to the transparent substrate 102 is targeted. The phase shift features 110 may be formed by a subtractive process where a thickness of the transparent substrate 102 is etched away. A thickness of between about 2,000 Angstroms and 3,000 Angstroms of the transparent substrate 102 are removed in the phase shift areas.

The phase shift features 110 are formed overlying the active areas of the planned transistors. The phase shift features 110 are formed adjacent to the opaque features 112 and cover one side of the planned transistors. This approach takes advantage of the principle of phase shifting. When a photoresist layer is exposed through the AAPSM 100 the phase difference between the transparent substrate 102 and the phase shift features 110 will cause the very narrow opaque features to transfer to the photoresist layer without overexposure. Using this technique, pattern widths as small as between about 0.07 microns and 0.15 microns can be created in the photoresist layer and then etched into the polysilicon layer to form the transistor gates. In addition, because the phase shift features extend over the boundaries of the active areas and onto the STI regions, any unwanted patterns that may be formed by unexposed photoresist due to conflicts between light traversing the transparent substrate 102 and light traversing the phase shift features 110 will occur over the shallow trench isolation area, not over the polysilicon layer.

Figure 13:
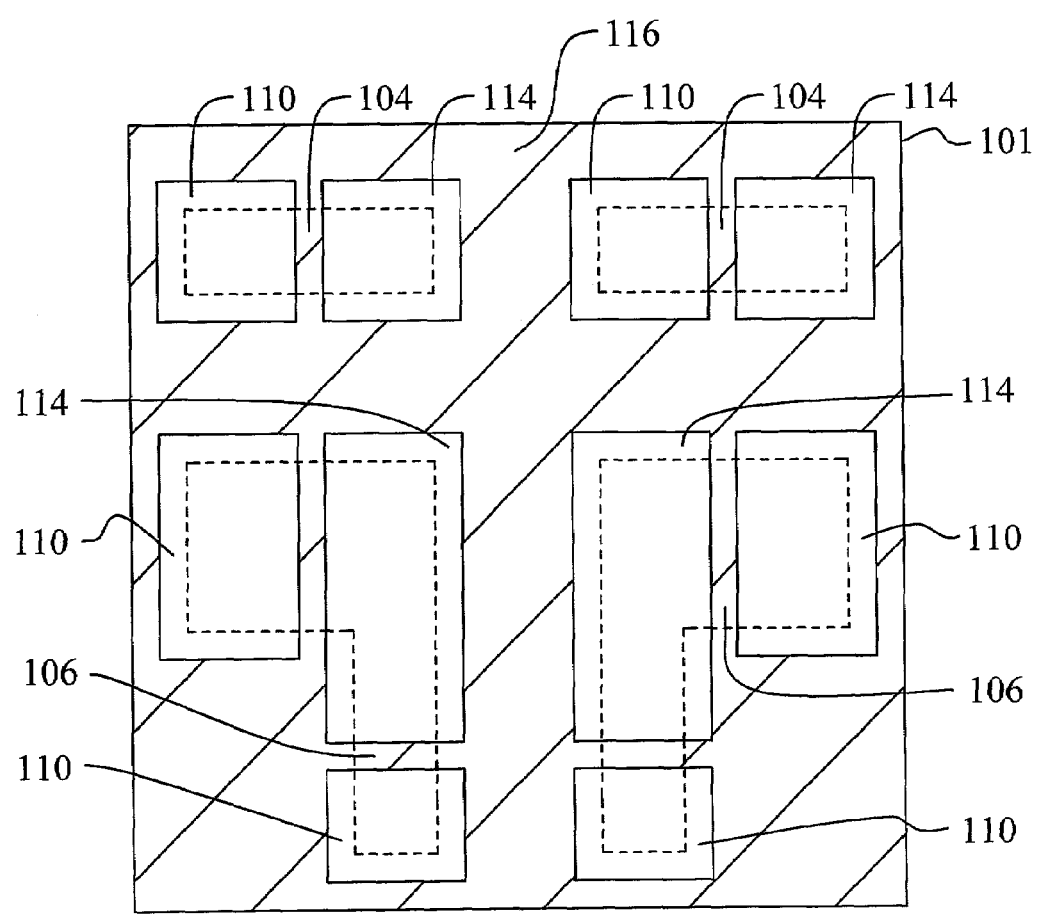

Referring now to FIG. 13, a dark field version of the same AAPSM mask 101 is shown. In the dark field version, the polysilicon gate data is combined with the non-active areas of the layout to form opaque features 116 covering most of the circuit. Openings are formed in the opaque material for transparent substrate, or 0 degree phase shift, areas 114 and for 180 degrees phase shift areas 110. The mask 101 is fabricated with the same materials and steps as the clear field version of FIG. 12. As in the clear field version, the dark field AAPSM mask 101 uses the phase shift to facilitate a sharp transfer of the opaque features 116 onto the photoresist. In this case, the potential phase conflict is eliminated by the presence of the opaque features everywhere outside the active areas. Of course, the patterns outside of the active areas are still unwanted but will have no adverse effect due to the presence of the extended STI regions.

Figure 14:
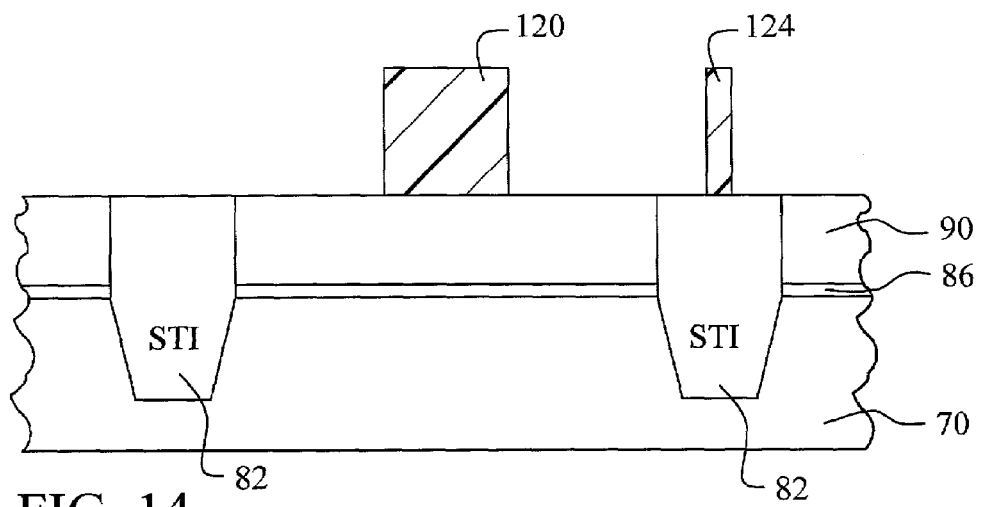

Referring now to FIG. 14, the next cross sectional view of the preferred embodiment is shown. The photoresist layer is deposited and patterned using the AAPSM mask. The photoresist is exposed using a lithographic tool that utilizes a spectral wavelength of either about 193 nanometers or about 248 nanometers. The remaining photoresist layer after developing is shown with gate areas 120 defined. Note that some undesired photoresist 124 is left as a pattern due to the phase conflict. The unwanted photoresist pattern 124 overlies the STI regions 82.

Figure 15:
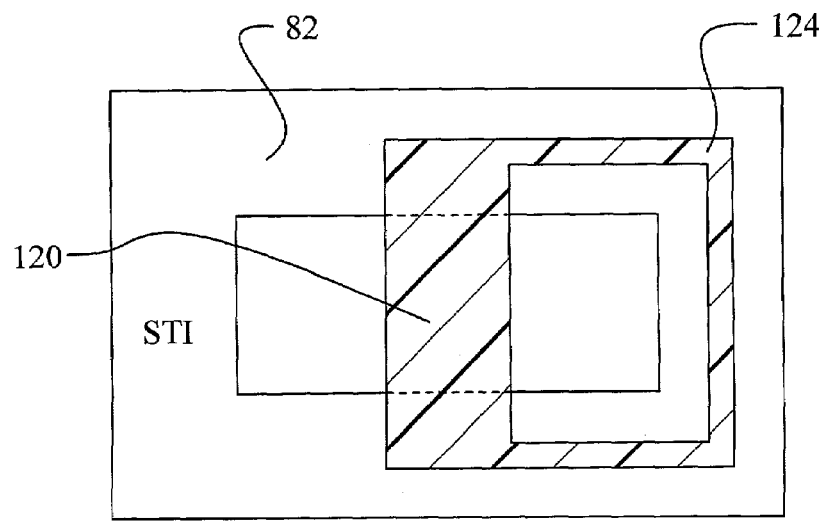

Referring now to FIG. 15, a top view of the transistor is shown. Note how the entire unwanted photoresist pattern 124 overlies the STI regions 82.

Figure 16:
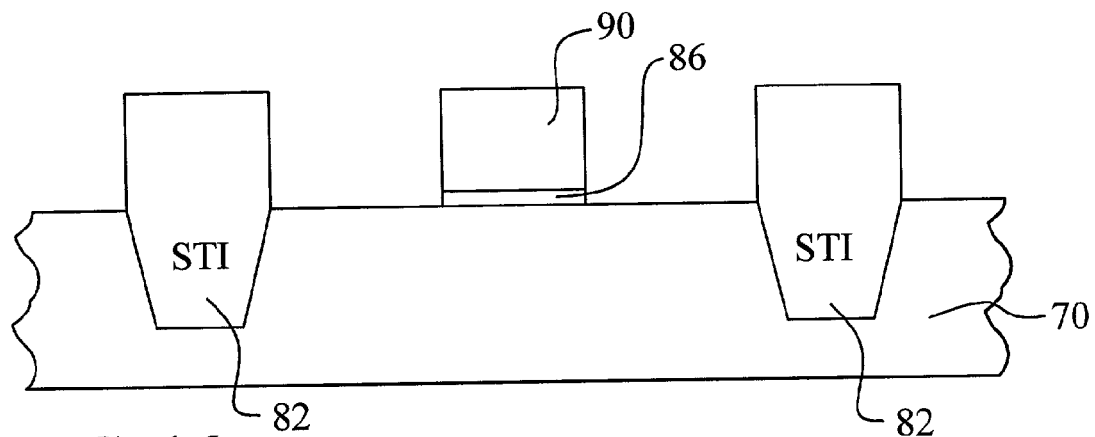
Figure 17:
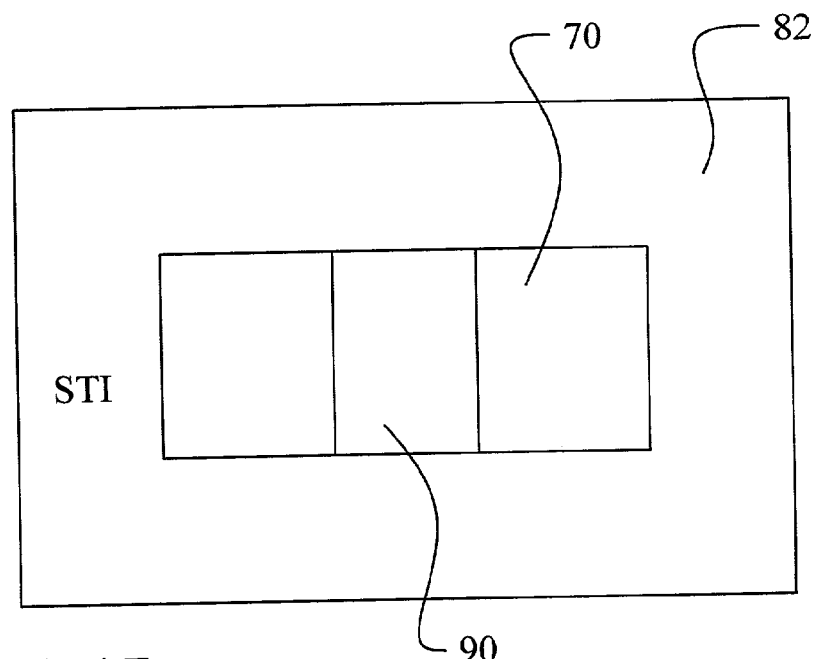

Referring now to FIG. 16, the polysilicon layer 90 is etched to form the polysilicon gates 90. The photoresist layer is stripped away. FIG. 17 depicts a top view of the same transistor. Note that the polysilicon gates 90 are confined to the active areas between the STI regions. The polysilicon transistor gates are etched to a width of between about 0.07 microns and 0.15 microns.

Figure 18:
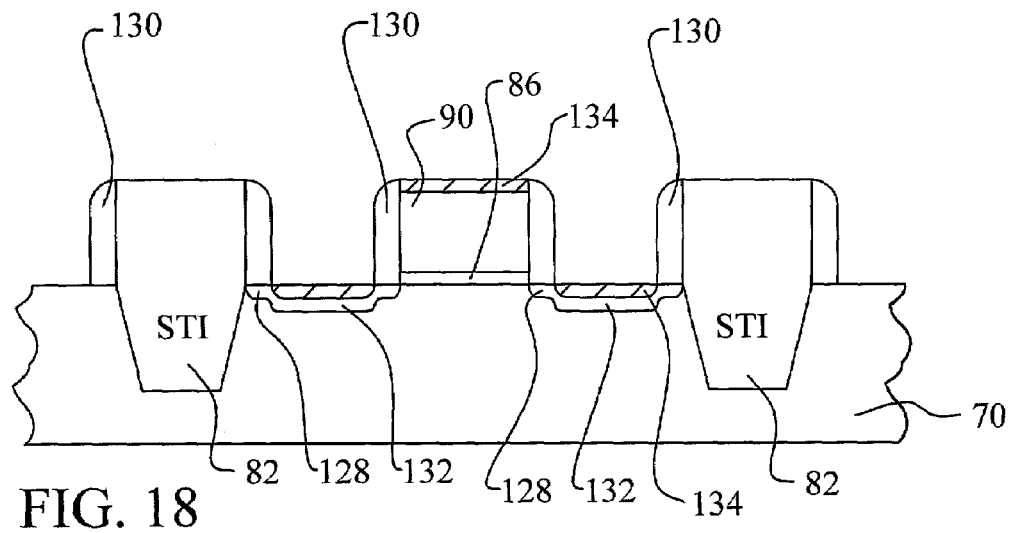

Referring now to FIG. 18, ions are implanted to form lightly doped drains 128. Silicon nitride sidewall spacers 130 are formed, by a conventional process, adjacent to the polysilicon gates 90 and the shallow trench isolations 82. Ions are then implanted to form source and drain regions 132. A metal silicide layer 134 comprising, for example, $TiSi_2$, $CoSi_2$, or $NiSi$, is formed in the semiconductor substrate source and drain regions 132 and on the polysilicon gates 90. The metal silicide layer 134 reduces the contact resistance and the parasitic source/drain resistance.

Figure 19:
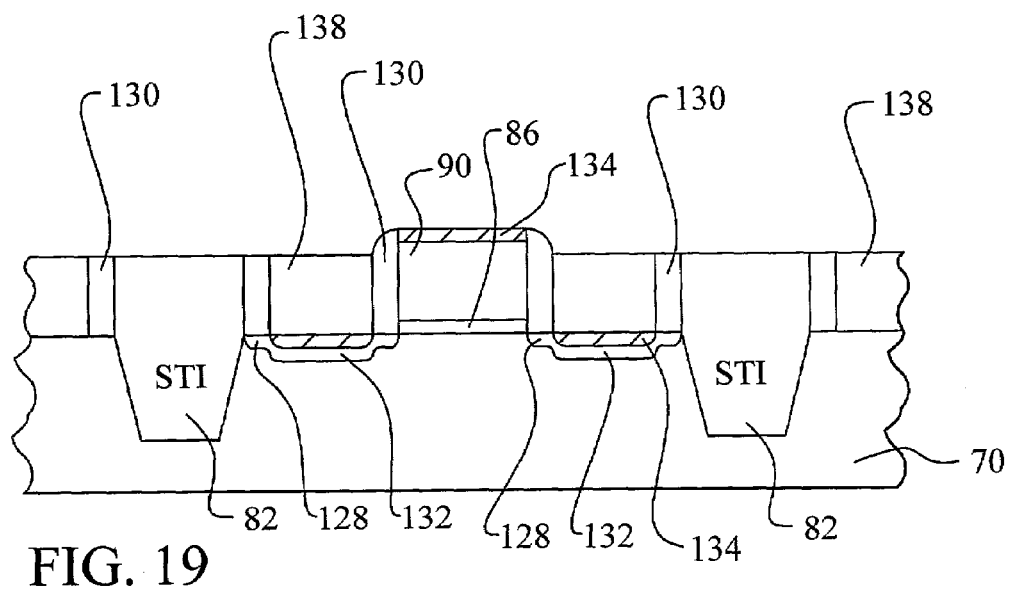

Referring now to FIG. 19, an interlevel oxide layer 138 is deposited overlying the polysilicon gates 90, the source and drain regions, and the shallow trench isolations 82. The interlevel oxide layer 138 preferably comprises a boron and phosphorous doped silicon dioxide (BPSG) deposited by a CVD process to a thickness of between about 5,000 Angstroms and 10,000 Angstroms. The interlevel oxide layer 138 is polished down to the top surface of the polysilicon gates 90. A brief over polish is performed to create a slight recess of the interlevel oxide layer 138.

Figure 20:
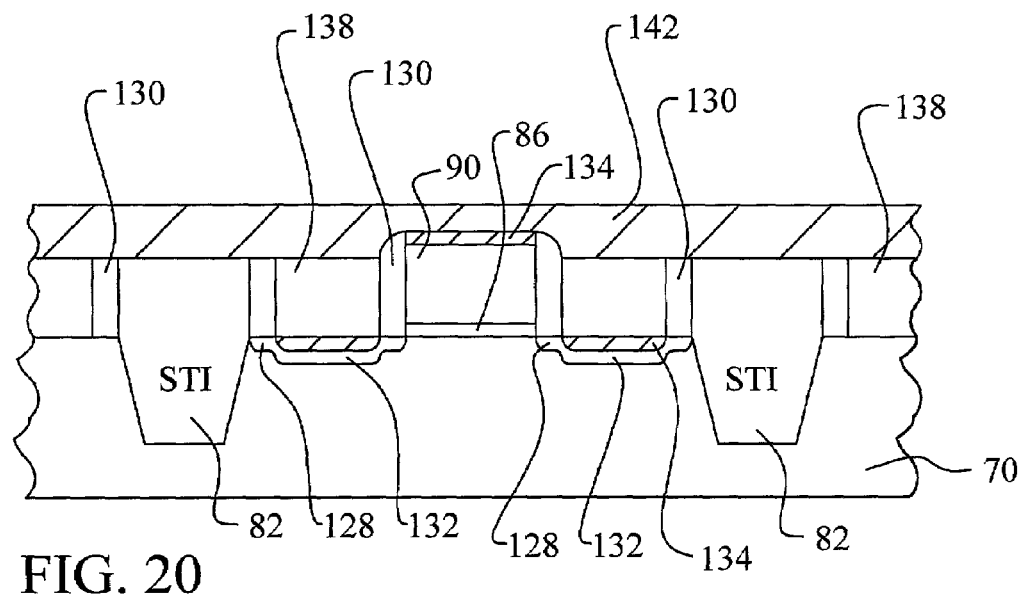

Referring now to FIG. 20, a conductive layer 142 is deposited overlying the polysilicon gates 90. This conductive layer 142 may comprise tungsten silicide or a combination of titanium and titanium nitride. If tungsten silicide is used, this layer may be formed by physical vapor deposition (PVD). If a combination titanium and titanium nitride layer is used, the titanium layer is deposited to a thickness of between about 100 Angstroms and 200 Angstroms while the titanium nitride layer is deposited to a thickness of between about 200 Angstroms and 1,000 Angstroms.

Figure 21:
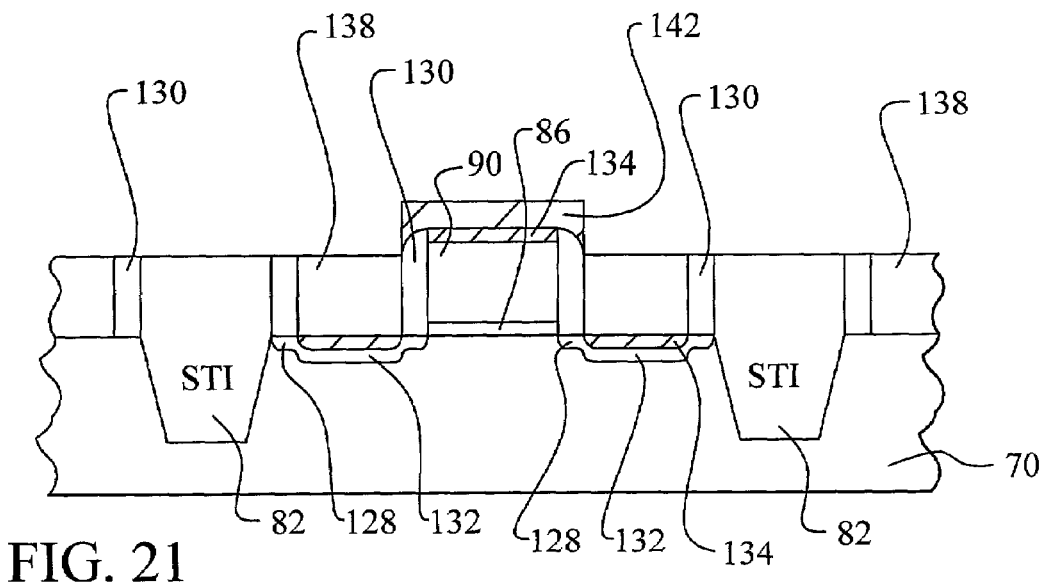

Referring now to FIG. 21, the conductive layer 142 is patterned to form interconnect lines from the polysilicon gates 90 to other circuit features. This completes the fabrication of the transistor in the manufacture of the integrated circuit device. The conductive layer 142 overlaps the polysilicon gate by between about 0.05 microns and 0.15 microns to insure connectivity when a misalignment occurs. The conductive layer 142 is only patterned in this way in areas having a relatively flat topology where depth of focus (DOF) issues are minimized. Since layer 142 has a thickness of less than about 1000 Angstroms while the polysilicon gate has a thickness of about 2000 Angstroms, there are less DOF issues for the contact and first metal patterning because of relatively flat topology.

Figure 7:
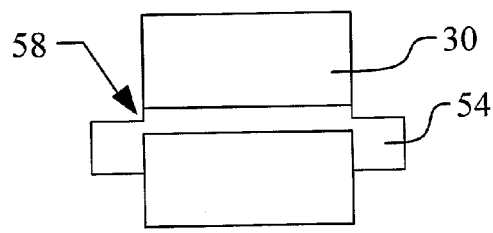
Figure 22:
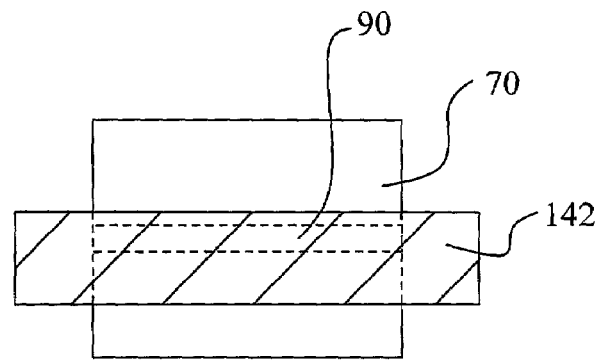

Referring now to FIG. 22, a top view of a representative transistor formed by the process of the present invention is shown. The conductive layer 142 is shown overlying the polysilicon gate 90. The polysilicon gate 90 crosses and overlies the active area 70 of the transistor. The illustration depicts a large misalignment between the conductive layer 142 and the polysilicon gate 90. However, there is no adverse effect due to the misalignment. Compare this to the prior art example of FIG. 7, where a misalignment of this magnitude causes a highly resistive or open connection to the gate. A significant advantage of the present invention is demonstrated.

Figure 1:
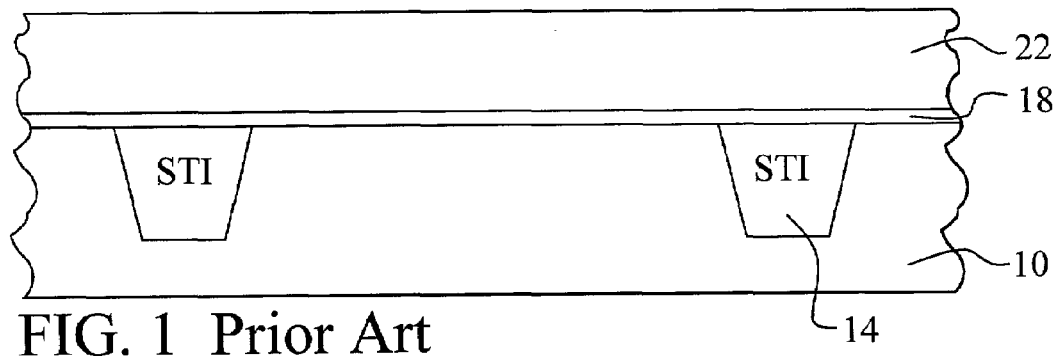
FIGS. 1 through 7 schematically illustrate a partially completed prior art integrated circuit device using an AAPSM method.
Figure 2:
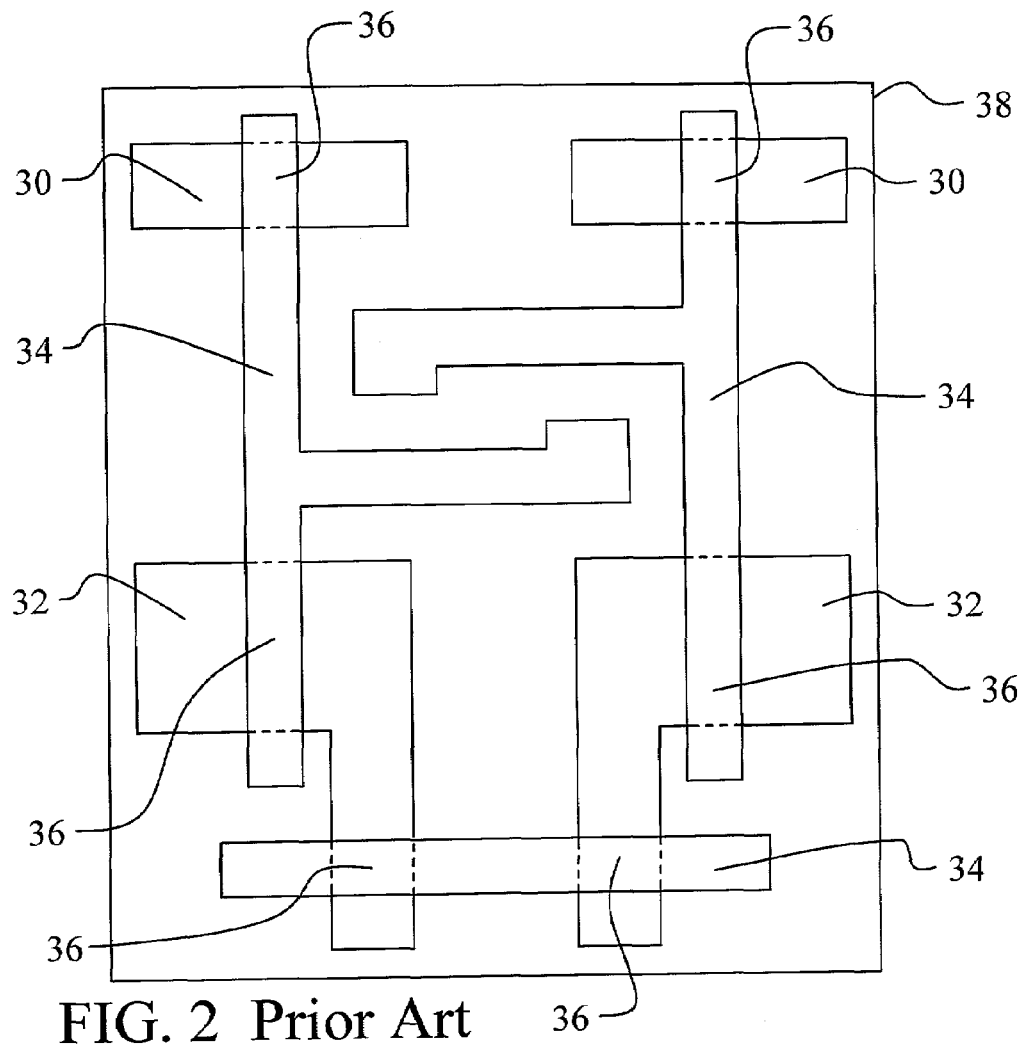
Figure 3:
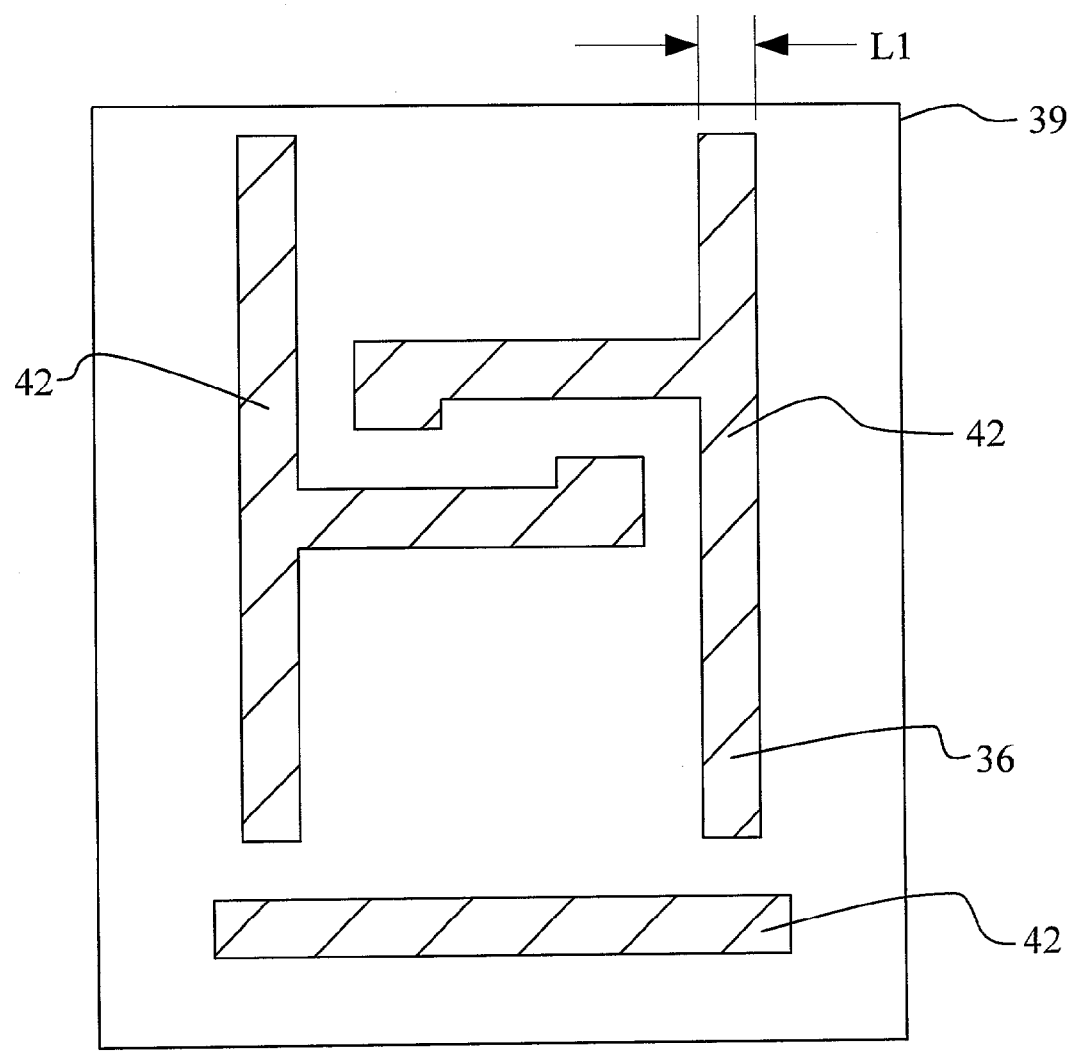
Figure 4:
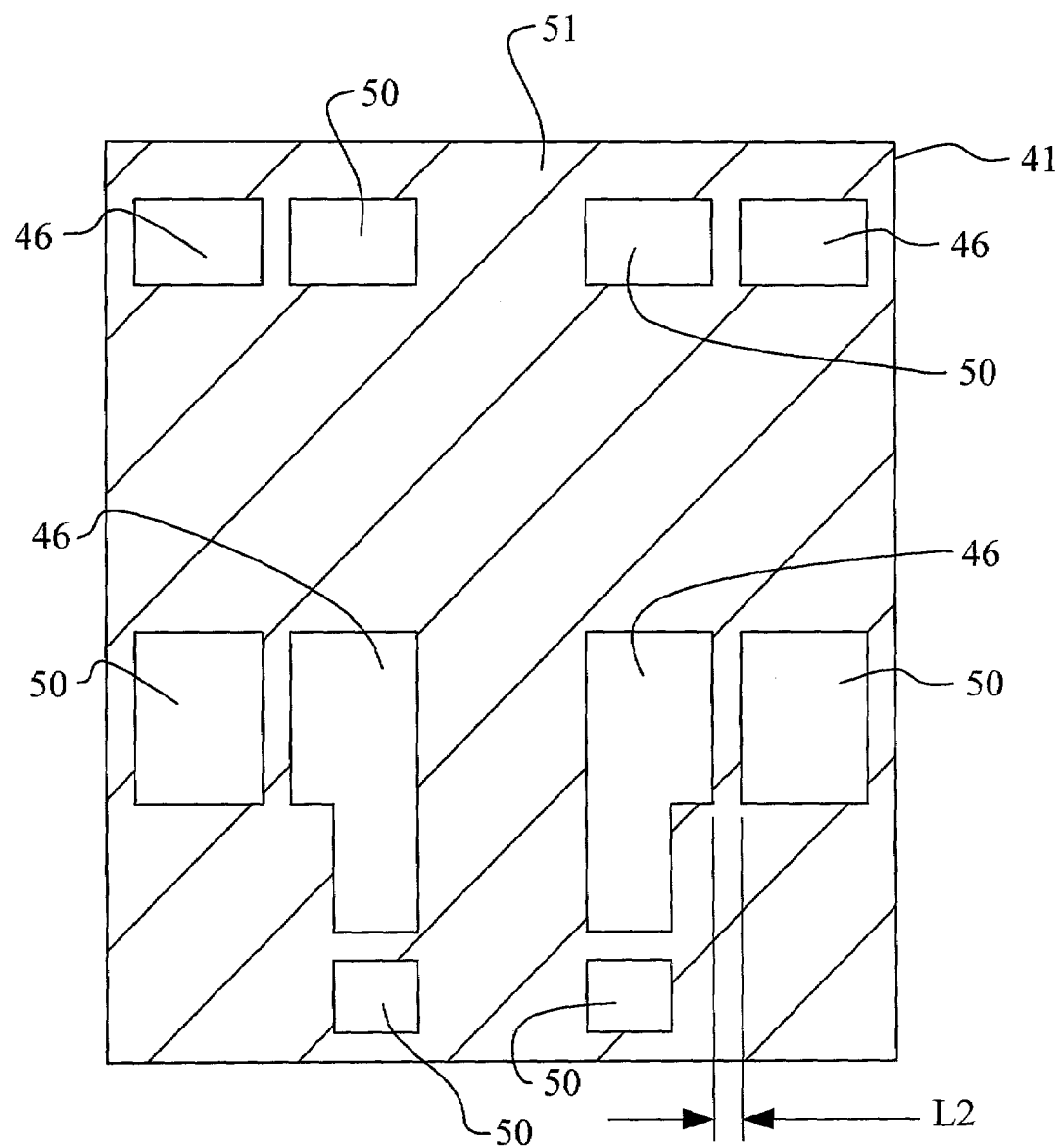
Figure 5:
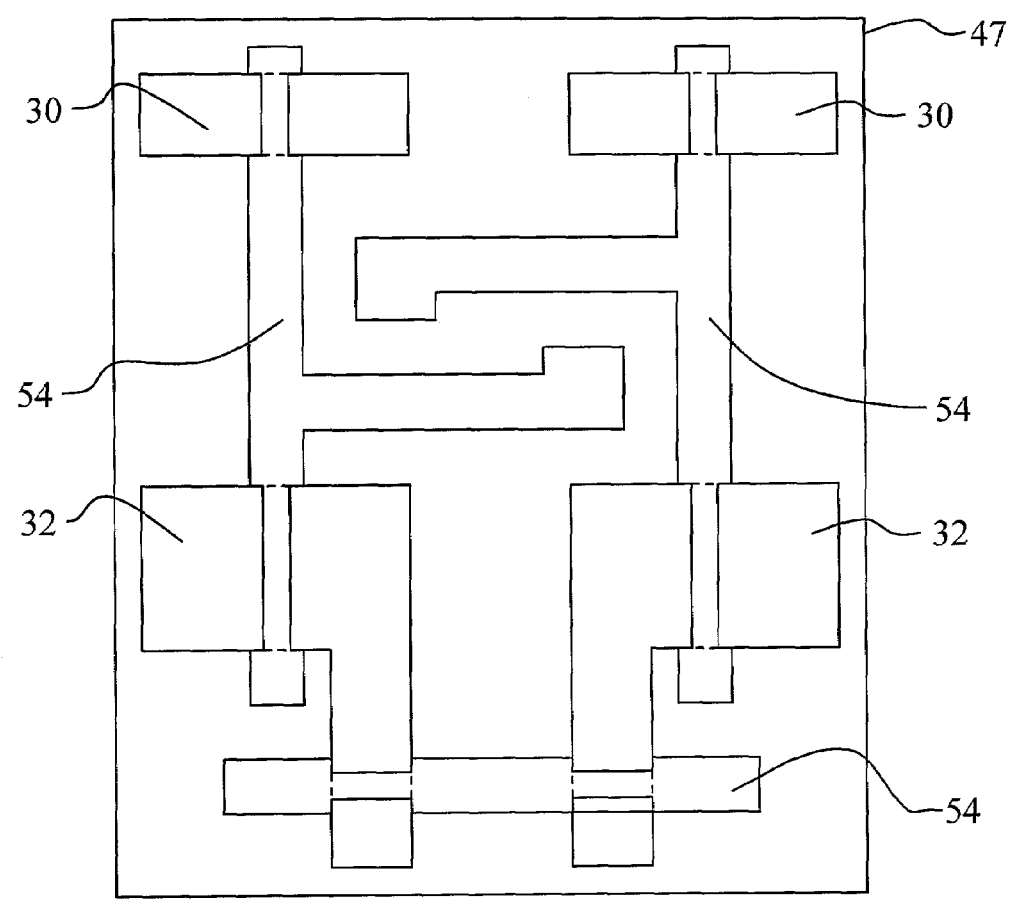
Figure 6:
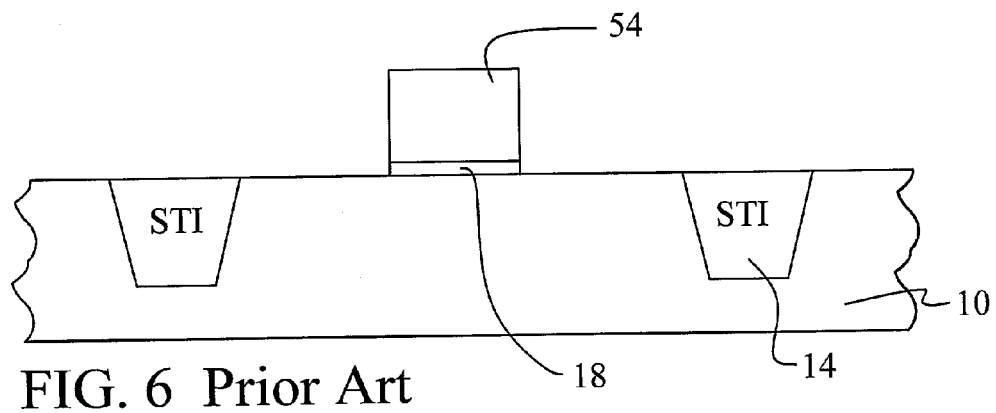
Figure 23:
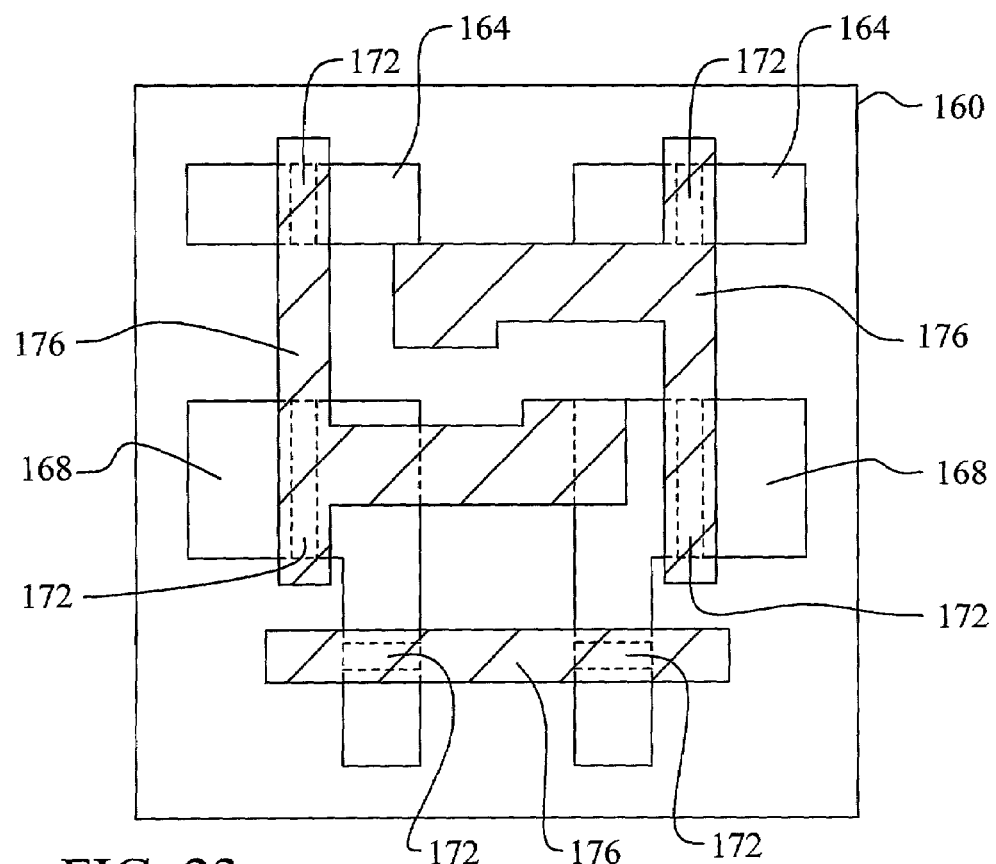

Referring now to FIG. 23, a final top view shows a memory cell 160 created in the process of the present invention. Polysilicon transistor gates 172 are formed over the p-well active areas 164 and the n-well active areas 168. The conductive layer 176 connects the polysilicon gates 172 to each other and to other possible components. Note how the memory cell 160 size is smaller than to that of the prior art memory cell illustrated in FIG. 5. The cell can be made smaller because the conductive layer 176 can be routed over the active areas 164, 168. In the prior art, the polysilicon layer used for connectivity must be routed over STI regions and spaced from active areas.

As shown in the preferred embodiments, the present invention provides a very manufacturable process for fabricating a polysilicon gate transistor using an alternating aperture phase shift mask (AAPSM) in an integrated circuit device. In addition, a method to form the AAPSM mask is provided. The novel approach facilitates a process that provides several benefits. First, the method allows a 248 nanometer lithographic tool to print fine lines down to 0.07 microns. Second, machine time is reduced by eliminating a double reticle change and exposure. Only a single mask step is required to define the polysilicon gates. Third, since a separate layer is used for the interconnect, the layout can be shrunk. Fourth, device performance can be improved because smaller gate lengths are created. Fifth, the method is less sensitive to misalignment between the polysilicon gate mask and the interconnect layer.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a polysilicon transistor gate in the manufacture of an integrated circuit device comprising:
   providing a semiconductor substrate;
   forming a gate dielectric layer overlying said semiconductor substrate;
   depositing a polysilicon layer overlying said gate dielectric layer;
   etching said polysilicon layer, said gate dielectric layer, and said semiconductor substrate to form trenches for planned shallow trench isolations;
   depositing a trench oxide layer overlying said polysilicon layer and filling said trenches;
   polishing down said trench oxide layer to the top surface of said polysilicon layer to complete said shallow trench isolations;

depositing a photoresist layer overlying said polysilicon layer;

patterning said photoresist layer to form a feature mask for planned polysilicon gates wherein said patterning is by a single exposure through an alternating aperture phase shift mask and wherein unwanted features in said photoresist layer caused by phase conflicts overlie said shallow trench isolations such that a trimming layer at phase transitions is not needed; and etching said polysilicon layer using said feature mask to form said polysilicon gates in the manufacture of the integrated circuit device wherein the presence of said unwanted features overlying said shallow trench isolations eliminates their transfer to said polysilicon layer.

2. The method according to claim 1 wherein said shallow trench isolations extend above the top surface of said semiconductor substrate between about 1,000 Angstroms and 3,500 Angstroms.

3. The method according to claim 1 wherein said alternating aperture phase shift mask uses a 0 degree phase and a 180 degree phase.

4. The method according to claim 1 wherein said polysilicon transistor gates are etched to a line width of between about 0.07 microns and 0.15 microns.

5. The method according to claim 1 further comprising:
depositing a conductive layer overlying said polysilicon transistor gates; and
patterning said conductive layer to form interconnect lines from said polysilicon transistor gates to other circuit features.

6. The method according to claim 5 wherein said conductive layer comprises one of the group of: tungsten silicide and a combination of titanium and titanium nitride.

7. The method according to claim 1 wherein said polysilicon layer is deposited to a thickness of between about 1,500 Angstroms and 2,500 Angstroms.

8. The method according to claim 1 wherein said single exposure is by a lithographic tool using a light wavelength comprising one of the group of: about 193 nanometers and about 248 nanometers.

9. A method of fabricating a polysilicon transistor gate in the manufacture of an integrated circuit device comprising:
providing a semiconductor substrate;
forming a gate dielectric layer overlying said semiconductor substrate;
depositing a polysilicon layer overlying said gate dielectric layer;
etching said polysilicon layer, said gate dielectric layer, and said semiconductor substrate to form trenches for planned shallow trench isolations;
depositing a trench oxide layer overlying said polysilicon layer and filling said trenches;
polishing down said trench oxide layer to the top surface of said polysilicon layer to complete said shallow trench isolations;
depositing a photoresist layer overlying said polysilicon layer;
patterning said photoresist layer to form a feature mask for planned polysilicon gates wherein said patterning is by a single exposure through an alternating aperture phase shift mask and wherein unwanted features in said photoresist layer caused by phase conflicts overlie said shallow trench isolations such that a trimming layer at phase transitions is not needed;
etching said polysilicon layer using said feature mask to form said polysilicon gates wherein the presence of said unwanted features overlying said shallow trench isolations eliminates their transfer to said polysilicon layer;
stripping away said photoresist layer;
implanting ions into said semiconductor substrate to form lightly doped drains;
forming silicon nitride sidewall spacers adjacent to said polysilicon gates and said shallow trench isolations;
implanting ions into said semiconductor substrate to form source and drain regions;
forming a titanium silicide layer in said source and drain regions and said polysilicon gates;
depositing an interlevel oxide layer overlying said polysilicon gates, said shallow trench isolations, and said semiconductor substrate;
polishing down said interlevel oxide layer to the top surface of said polysilicon gates;
depositing a conductive layer overlying said polysilicon transistor gates; and
patterning said conductive layer to form interconnect lines from said polysilicon transistor gates to other circuit features and complete said transistor in the manufacture of the integrated circuit device.

10. The method according to claim 9 wherein said shallow trench isolations extend above the top surface of said semiconductor substrate between about 1,500 Angstroms and 3,500 Angstroms.

11. The method according to claim 9 wherein said alternating aperture phase shift mask uses a 0 degree phase and a 180 degree phase.

12. The method according to claim 9 wherein said polysilicon transistor gates are etched to a line width of between about 0.07 microns and 0.15 microns.

13. The method according to claim 9 wherein said polysilicon layer is deposited to a thickness of between about 1,500 Angstroms and 2,500 Angstroms.

14. The method according to claim 9 wherein said single exposure is by a lithographic tool using a light wavelength comprising one of the group of: about 193 nanometers and about 248 nanometers.

15. The method according to claim 9 wherein said conductive layer comprises tungsten silicide.

16. The method according to claim 9 wherein said conductive layer comprises a combination titanium and titanium nitride.

17. The method according to claim 9 wherein said conductive layer completely overlaps said polysilicon gates by between about 0.05 microns and 0.15 microns to insure connectivity when misaligned.

18. A method of fabricating a transistor gate in the manufacture of an integrated circuit device comprising:
providing a semiconductor substrate;
providing a first region comprising a conductive layer overlying said semiconductor substrate with a first dielectric layer therebetween;
providing a second region comprising a second dielectric layer disposed in a trench in said semiconductor substrate wherein the said conductive layer does not overlie said second dielectric layer;
depositing a photoresist layer overlying said polysilicon layer;
patterning said photoresist layer to form a feature mask for planned transistor gates wherein said patterning is by a single exposure through an alternating aperture phase shift mask and wherein unwanted features in said photoresist layer caused by phase conflicts overlie said shallow trench isolations such that a trimming layer at phase transitions is not needed; and etching said conductive layer using said feature mask to form said transistor gates in the manufacture of the integrated circuit device wherein the presence of said unwanted features overlying said shallow trench isolations eliminates their transfer to said conductive layer.

19. The method according to claim 18 wherein said alternating aperture phase shift mask uses a 0 degree phase and a 180 degree phase.

20. The method according to claim 18 wherein said single exposure is by a lithographic tool using a light wavelength comprising one of the group of: about 193 nanometers and about 248 nanometers.

* * * * *